(12) United States Patent  
Kwon et al.

(10) Patent No.: US 8,030,134 B2
(45) Date of Patent: Oct. 4, 2011

(54) STACKED SEMICONDUCTOR PACKAGE HAVING ADHESIVE/SPACER STRUCTURE AND INSULATION

(75) Inventors: Hyeog Chan Kwon, Seoul (KR); Marcos Karnezos, Palo Alto, CA (US)

(73) Assignee: Chippac, Inc., Fremont, CA (US)

( * ) Notice: Subject to any disclaimer, the term of this patent is extended or adjusted under 35 U.S.C. 154(b) by 0 days.

(21) Appl. No.: 11/536,424

(22) Filed: Sep. 28, 2006

(65) Prior Publication Data

US 2007/0018296 A1    Jan. 25, 2007

Related U.S. Application Data

(60) Division of application No. 11/134,035, filed on May 20, 2005, now abandoned, which is a continuation-in-part of application No. 10/969,303, filed on Oct. 20, 2004, now abandoned.

(60) Provisional application No. 60/573,956, filed on May 24, 2004, provisional application No. 60/573,903, filed on May 24, 2004.

(51) Int. Cl.
    *H01L 21/00*  (2006.01)
(52) U.S. Cl. ........ 438/109; 438/106; 438/107; 257/686; 257/723; 257/725; 257/E25.006; 257/E25.025
(58) Field of Classification Search .................. 257/686, 257/723, 725, E25.006, E25.025; 438/106, 438/107, 109, 110
    See application file for complete search history.

(56) References Cited

U.S. PATENT DOCUMENTS

| 5,140,404 A | 8/1992 | Fogal et al. |
| 5,218,229 A | 6/1993 | Farnworth |
| 5,222,014 A | 6/1993 | Lin |
| 5,229,960 A | 7/1993 | De Givry |
| 5,323,060 A | 6/1994 | Fogal et al. |
| 5,340,771 A | 8/1994 | Rostoker |
| 5,372,883 A | 12/1994 | Shores |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,652,185 A | 7/1997 | Lee |

(Continued)

FOREIGN PATENT DOCUMENTS

JP    05152505 A    6/1993

(Continued)

OTHER PUBLICATIONS

Lintec Semiconductor-Related Products Web Site, "Adwill Semiconductor-Related Products", 1 page, http://www.lintec.co.jp/e-dept/english/adwill/adwill.html, downloaded Mar. 1, 2004.

(Continued)

*Primary Examiner* — Evan Pert
*Assistant Examiner* — Eduardo A Rodela

(57) ABSTRACT

Stacked semiconductor assemblies in which a first die is mounted active side upward on a first substrate and is electrically interconnected to the substrate by wire bonding; an adhesive/spacer structure is formed upon the active side of the first die; and a device such as a die or a package or a heat spreader, having an electrically nonconductive side, is mounted upon the adhesive/spacer structure with the electrically nonconductive side facing the first wire bonded die. The side of the device facing the first wire bonded die may be made electrically nonconductive by having an electrically insulating layer, such as a dielectric film adhesive. Also, methods for making the assemblies are disclosed.

32 Claims, 6 Drawing Sheets

U.S. PATENT DOCUMENTS

| | | | |
|---|---|---|---|
| 5,744,863 A | 4/1998 | Culnane et al. | |
| 5,776,799 A | 7/1998 | Song et al. | |
| 5,898,219 A | 4/1999 | Barrow | |
| 5,899,705 A | 5/1999 | Akram | |
| 5,903,049 A | 5/1999 | Mori | |
| 5,945,733 A | 8/1999 | Corbett et al. | |
| 5,977,640 A | 11/1999 | Bertin et al. | |
| 5,982,633 A | 11/1999 | Jeansonne | |
| 5,994,166 A | 11/1999 | Akram et al. | |
| 6,025,648 A | 2/2000 | Takahashi et al. | |
| 6,034,875 A | 3/2000 | Heim et al. | |
| 6,075,289 A | 6/2000 | Distefano | |
| 6,118,176 A | 9/2000 | Tao et al. | |
| 6,133,626 A | 10/2000 | Hawke et al. | |
| 6,157,080 A | 12/2000 | Tamaki et al. | |
| 6,201,266 B1 | 3/2001 | Ohuchi et al. | |
| 6,201,302 B1 | 3/2001 | Tzu | |
| 6,238,949 B1 | 5/2001 | Nguyen et al. | |
| 6,265,763 B1 | 7/2001 | Jao et al. | |
| 6,265,766 B1 | 7/2001 | Moden | |
| 6,274,930 B1 | 8/2001 | Vaiyapuri et al. | |
| 6,316,838 B1 | 11/2001 | Ozawa et al. | |
| 6,333,552 B1 | 12/2001 | Kakimoto et al. | |
| 6,333,562 B1 | 12/2001 | Lin | |
| 6,340,846 B1 | 1/2002 | LoBianco et al. | |
| 6,351,028 B1 | 2/2002 | Akram | |
| 6,376,904 B1 | 4/2002 | Haba et al. | |
| 6,388,313 B1 | 5/2002 | Lee et al. | |
| 6,400,007 B1 | 6/2002 | Wu et al. | |
| 6,407,456 B1 | 6/2002 | Ball | |
| 6,413,798 B2 | 7/2002 | Asada | |
| 6,414,381 B1 | 7/2002 | Takeda | |
| 6,424,050 B1 | 7/2002 | Komiyama | |
| 6,436,732 B2 | 8/2002 | Ahmad | |
| 6,441,496 B1 * | 8/2002 | Chen et al. | 257/777 |
| 6,445,064 B1 | 9/2002 | Ishii et al. | |
| 6,462,421 B1 | 10/2002 | Hsu et al. | |
| 6,472,732 B1 | 10/2002 | Terui | |
| 6,472,741 B1 | 10/2002 | Chen et al. | |
| 6,472,758 B1 | 10/2002 | Glenn et al. | |
| 6,489,676 B2 | 12/2002 | Taniguchi et al. | |
| 6,492,726 B1 | 12/2002 | Quek et al. | |
| 6,501,165 B1 | 12/2002 | Farnworth | |
| 6,503,821 B2 | 1/2003 | Farquhar et al. | |
| 6,512,303 B2 | 1/2003 | Moden | |
| 6,538,319 B2 | 3/2003 | Terui | |
| 6,545,365 B2 | 4/2003 | Kondo et al. | |
| 6,545,366 B2 | 4/2003 | Michii et al. | |
| 6,552,423 B2 | 4/2003 | Song et al. | |
| 6,555,902 B2 | 4/2003 | Lo et al. | |
| 6,569,709 B2 | 5/2003 | Derderian | 438/109 |
| 6,570,249 B1 | 5/2003 | Liao et al. | |
| 6,583,503 B2 | 6/2003 | Akram et al. | |
| 6,590,281 B2 | 7/2003 | Wu et al. | |
| 6,593,647 B2 | 7/2003 | Ichikawa | |
| 6,593,648 B2 | 7/2003 | Emoto | |
| 6,593,662 B1 * | 7/2003 | Pu et al. | 257/777 |
| 6,599,779 B2 | 7/2003 | Shim et al. | |
| 6,607,937 B1 | 8/2003 | Corisis | |
| 6,611,063 B1 | 8/2003 | Ichinose et al. | |
| 6,620,651 B2 | 9/2003 | He et al. | |
| 6,621,169 B2 | 9/2003 | Kikuma et al. | |
| 6,621,172 B2 | 9/2003 | Nakayama et al. | |
| 6,649,448 B2 | 11/2003 | Tomihara | |
| 6,650,009 B2 | 11/2003 | Her et al. | |
| 6,650,019 B2 * | 11/2003 | Glenn et al. | 257/777 |
| 6,660,560 B2 | 12/2003 | Chaudhuri et al. | 438/108 |
| 6,667,556 B2 | 12/2003 | Moden | |
| 6,690,089 B2 | 2/2004 | Uchida | |
| 6,700,178 B2 | 3/2004 | Chen et al. | |
| 6,706,557 B2 | 3/2004 | Koopmans | |
| 6,710,455 B2 | 3/2004 | Goller et al. | |
| 6,716,676 B2 | 4/2004 | Chen et al. | |
| 6,734,539 B2 | 5/2004 | Degani et al. | |
| 6,734,552 B2 | 5/2004 | Combs et al. | |
| 6,737,750 B1 | 5/2004 | Hoffman et al. | |
| 6,746,894 B2 | 6/2004 | Fee et al. | |
| 6,747,361 B2 | 6/2004 | Ichinose | |
| 6,753,613 B2 * | 6/2004 | Levardo et al. | 257/780 |
| 6,762,488 B2 | 7/2004 | Maeda et al. | |
| 6,777,799 B2 | 8/2004 | Kikuma et al. | |
| 6,777,819 B2 | 8/2004 | Huang | |
| 6,787,915 B2 | 9/2004 | Uchida et al. | |
| 6,787,916 B2 | 9/2004 | Halahan | |
| 6,794,749 B2 | 9/2004 | Akram | |
| 6,818,980 B1 | 11/2004 | Pedron, Jr. | |
| 6,828,665 B2 | 12/2004 | Pu et al. | |
| 6,833,287 B1 | 12/2004 | Hur et al. | 438/107 |
| 6,835,598 B2 | 12/2004 | Baek et al. | |
| 6,838,761 B2 | 1/2005 | Karnezos | |
| 6,847,105 B2 | 1/2005 | Koopmans | |
| 6,864,566 B2 | 3/2005 | Choi et al. | |
| 6,882,057 B2 | 4/2005 | Hsu | |
| 6,885,093 B2 | 4/2005 | Lo et al. | |
| 6,890,798 B2 | 5/2005 | McMahon | |
| 6,900,528 B2 | 5/2005 | Mess et al. | |
| 6,906,415 B2 | 6/2005 | Jiang et al. | |
| 6,906,416 B2 * | 6/2005 | Karnezos | 257/723 |
| 6,919,627 B2 * | 7/2005 | Liu et al. | 257/686 |
| 6,930,378 B1 | 8/2005 | St. Amand et al. | |
| 6,930,396 B2 * | 8/2005 | Kurita et al. | 257/777 |
| 6,933,598 B2 | 8/2005 | Karnezos | |
| 6,951,982 B2 | 10/2005 | Chye et al. | |
| 6,972,481 B2 | 12/2005 | Karnezos | |
| 7,034,387 B2 | 4/2006 | Karnezos | |
| 7,034,388 B2 | 4/2006 | Yang et al. | |
| 7,045,887 B2 | 5/2006 | Karnezos | |
| 7,049,691 B2 | 5/2006 | Karnezos | |
| 7,053,476 B2 | 5/2006 | Karnezos | |
| 7,053,477 B2 | 5/2006 | Karnezos | |
| 7,057,269 B2 | 6/2006 | Karnezos | |
| 7,061,088 B2 | 6/2006 | Karnezos | |
| 7,064,426 B2 | 6/2006 | Karnezos | |
| 7,071,568 B1 | 7/2006 | St. Amand et al. | |
| 7,081,678 B2 | 7/2006 | Liu | |
| 7,101,731 B2 | 9/2006 | Karnezos | |
| 2002/0096755 A1 * | 7/2002 | Fukui et al. | 257/686 |
| 2002/0130404 A1 | 9/2002 | Ushijima et al. | |
| 2003/0038357 A1 | 2/2003 | Derderian | |
| 2003/0038374 A1 | 2/2003 | Shim et al. | |
| 2003/0054162 A1 | 3/2003 | Watson | 428/343 |
| 2003/0113952 A1 | 6/2003 | Sambasivam et al. | |
| 2003/0141582 A1 | 7/2003 | Yang et al. | 257/686 |
| 2003/0153134 A1 | 8/2003 | Kawata et al. | |
| 2003/0178710 A1 | 9/2003 | Kang et al. | |
| 2004/0016939 A1 | 1/2004 | Akiba et al. | |
| 2004/0026768 A1 | 2/2004 | Taar et al. | |
| 2004/0061213 A1 | 4/2004 | Karnezos | |
| 2004/0195667 A1 * | 10/2004 | Karnezos | 257/686 |
| 2004/0212096 A1 | 10/2004 | Wang | |
| 2004/0222509 A1 * | 11/2004 | Ogata | 257/686 |
| 2005/0090050 A1 | 4/2005 | Shim et al. | |
| 2005/0106779 A1 | 5/2005 | Bolken et al. | 438/106 |
| 2005/0224959 A1 | 10/2005 | Kwon et al. | 257/723 |
| 2006/0043556 A1 | 3/2006 | Su et al. | |
| 2006/0138631 A1 | 6/2006 | Tao et al. | |
| 2006/0189033 A1 | 8/2006 | Kim | |
| 2006/0197209 A1 | 9/2006 | Choi et al. | |

FOREIGN PATENT DOCUMENTS

| | | | |
|---|---|---|---|
| JP | 2001223326 A | 8/2001 | |
| KR | 20010688614 A | 7/2001 | |
| KR | 2004085348 A | 10/2004 | |

OTHER PUBLICATIONS

Lintec Semiconductor-Related Products Web Site, "Products for Dicing Process", 2 pages, http://www.lintec.co.jp/e-dept/english/adwill/diceproces.html, downloaded Mar. 1, 2004.

Lintec Semiconductor-Related Products Web Site, "Products for back-grinding process", 1 page, http://www.lintec.co.jp/e-dept/english/adwill/bgproces.html, Downloaded Mar. 1, 2004.

* cited by examiner

STACKED SEMICONDUCTOR PACKAGE HAVING ADHESIVE/SPACER STRUCTURE AND INSULATION

CROSS-REFERENCE TO RELATED APPLICATIONS

This application is a Division of U.S. application Ser. No. 11/134,035, filed May 20, 2005, titled "Stacked semiconductor package having adhesive/spacer structure and insulation", which is a Continuation-in-Part of U.S. application Ser. No. 10/969,303, filed Oct. 20, 2004, titled "Multiple die package with adhesive/spacer structure and insulated die surface". The said U.S. application Ser. No. 10/969,303 claims priority from U.S. Provisional Application No. 60/573,956, filed May 24, 2004, titled "Multiple die package with adhesive/spacer structure and insulated die surface"; and also claims priority from related U.S. Provisional Application No. 60/573,903, filed May 24, 2004, titled "Adhesive/spacer island structure for multiple die package". This application is related to U.S. application Ser. No. 11/134,845, filed on May 20, 2005.

BACKGROUND

To obtain the maximum function and efficiency from a package having minimum dimensions, various types of increased density packages have been developed. Among these various types of packages is the multiple-die semiconductor chip package, commonly referred to as a multi-chip module, multi-chip package or stacked chip package. A multi-chip module includes one or more integrated circuit semiconductor chips, often referred to as circuit die, stacked one onto another to provide the advantages of light weight, high density, and enhanced electrical performance. To stack the semiconductor chips, each chip can be lifted by a chip-bonding tool, which is usually mounted at the end of a pick-and-place device, and mounted onto the substrate or onto a semiconductor chip mounted previously.

In some circumstances, such as when the upper die is smaller than the lower die and the lower die is a peripheral bonded die (that is die with bond pads positioned near the periphery of the die as opposed to a center bonded die in which the bond pads are positioned at a central region of the die), the upper die can be attached directly to the lower die without the use of spacers. However, when spacers are needed between the upper and lower die, spacer die, that is die without circuitry, can be used between the upper and lower die. In addition, adhesives containing spacer elements, typically micro spheres, are often used to properly separate the upper and lower die. See U.S. Pat. Nos. 5,323,060; 6,333,562; 6,340,846; 6,388,313; 6,472,758; 6,569,709; 6,593,662; 6,441,496; and U.S. Patent Publication No. US 2003/0178710.

After the chip mounting process, bonding pads of the chips are connected to bonding pads of the substrate with Au or Al wires during a wire bonding process to create an array of semiconductor chip devices. Finally, the semiconductor chips and their associated wires connected to the substrate are encapsulated, typically using an epoxy-molding compound, to create an array of encapsulated semiconductor devices. The molding compound protects the semiconductor devices from the external environment, such as physical shock and humidity. After encapsulation, the encapsulated devices are separated, typically by sawing, into individual semiconductor chip packages.

SUMMARY

In general, the invention features stacked semiconductor assemblies in which a device such as a die, or a package, or a heat spreader is stacked over a first wire-bonded die. An adhesive/spacer structure is situated between the first wire-bonded die and the device stacked over it, and the device has an electrically non-conductive surface facing the first wire-bonded die. That is, the first die is mounted active side upward on a first substrate and is electrically interconnected to the substrate by wire bonding; an adhesive/spacer structure is formed upon the active side of the first die; and a device such as a die or a package or a heat spreader, having an electrically nonconductive side, is mounted upon the adhesive/spacer structure with the electrically nonconductive side facing the first wire bonded die. The side of the device facing the first wire bonded die may be made electrically nonconductive by having an electrically insulating layer, such as a dielectric film adhesive.

In one aspect the invention features a multiple-die semiconductor chip assembly. A first die has a first surface bounded by a periphery and bond pads at the first surface. Wires are bonded to and extend from the bond pads outwardly past the periphery. A second die has an electrically non-conductive second surface positioned opposite the first surface. The first and second die define a first region therebetween. An adhesive/spacer structure, comprising spacer elements within an adhesive, is within the first region. The adhesive/spacer structure contacts the first and second surfaces and adheres the first and second die to one another at a chosen separation. The assembly may comprise a set of generally parallel wires which define a wire span portion of the first region. The adhesive/spacer structure is preferably located at other than the wire span portion of the first region.

In another aspect the invention features a method for adhering first and second die to one another at a chosen separation in a multiple-die semiconductor chip assembly. An adhesive/spacer material, having spacer elements within an adhesive, is selected. The adhesive/spacer material is deposited onto a first surface of a first die. The first surface is bounded by a periphery and has bond pads. A set of generally parallel wires is bonded to and extends from the bond pads outwardly past the periphery. The set of generally parallel wires define a wire span portion of the first surface. A second die, having an electrically non-conductive second surface, is selected. The second surface of the second die is located opposite the first surface of the first die and in contact with the adhesive/spacer material therebetween thereby securing the first and second die to one another at a chosen separation, the wire span portion of the first surface defining a wire span region between the first and second surfaces. The adhesive/spacer material is deposited in a manner to prevent any spacer elements from entering the wire span region.

In another aspect the invention features stacked semiconductor assemblies including an upper package stacked over a first wire-bonded die. The first die has a first surface bounded by a periphery and bond pads at the first surface. Wires are bonded to and extend from the bond pads outwardly past the periphery. An upper package has an electrically non-conductive second surface positioned opposite the first surface of the first die. The first die and the upper package define a first region therebetween. An adhesive/spacer structure, comprising spacer elements within an adhesive, is within the first region. The adhesive/spacer structure contacts the first and second surfaces and adheres the first die and the upper package to one another at a chosen separation. The assembly may comprise a set of generally parallel wires which define a wire span portion of the first region. The adhesive/spacer structure is preferably located at other than the wire span portion of the first region.

The upper package in the stacked semiconductor assembly includes at least one upper package die affixed to a die attach side of an upper package substrate. In some embodiments the upper package is oriented so that the die attach side of the upper package substrate faces the first die; that is, the upper package is inverted. In other embodiments the upper package is oriented so that the side of the upper package substrate opposite the die attach side faces the first die. The upper package may be any of a variety of package types can be suitable as the upper package.

In another aspect the invention features a method for adhering a die and a package to one another at a chosen separation in a stacked semiconductor package. An adhesive/spacer material, having spacer elements within an adhesive, is selected. The adhesive/spacer material is deposited onto a first surface of a first die. The first surface is bounded by a periphery and has bond pads. A set of generally parallel wires is bonded to and extends from the bond pads outwardly past the periphery. The set of generally parallel wires define a wire span portion of the first surface. A package, having an electrically non-conductive second surface, is selected. The second surface of the package is located opposite the first surface of the die and in contact with the adhesive/spacer material therebetween thereby securing the die and the package to one another at a chosen separation, the wire span portion of the first surface defining a wire span region between the first and second surfaces. The adhesive/spacer material is deposited in a manner to prevent any spacer elements from entering the wire span region.

Various features and advantages of the invention will appear from the following description in which the preferred embodiments have been set forth in detail in conjunction with the accompanying drawings.

DETAILED DESCRIPTION

Figure 1:
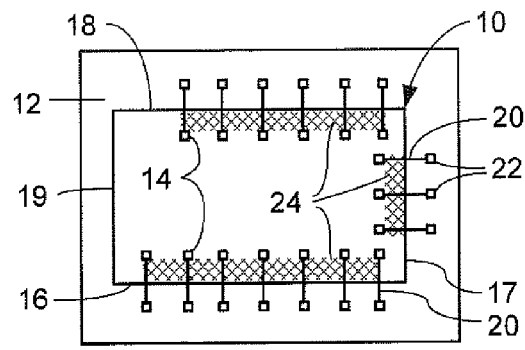
FIG. 1 is a simplified plan view of a conventional peripheral bonded die.

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Terms of orientation, such as "upper" and "lower" and the like are employed for reference to the relative orientation of the various features as shown in the FIGs., it being understood that any of the various assemblies can be deployed in any orientation in use.

Several prior art structures and embodiments made according to the invention are discussed below. Like reference numerals refer to like elements.

FIG. 1 illustrates a conventional peripheral bonded die 10 mounted to a substrate 12. Die 10 has bond Dads 14 along one, some or all of its peripheral edges 16-19. Wires 20 connect bond pads 14 to corresponding bond pads 22 on substrate 12. Wires 20 comprise sets of generally parallel wires along each peripheral edge 16-18 and define wire span areas 24, indicated by crosshatching in FIG. 1, along such edges. Bond pads 14 on peripheral bonded die 10 are typically placed very close to the corresponding peripheral edge 16-19, typically within 100 micrometers of the peripheral edge.

Figure 2:
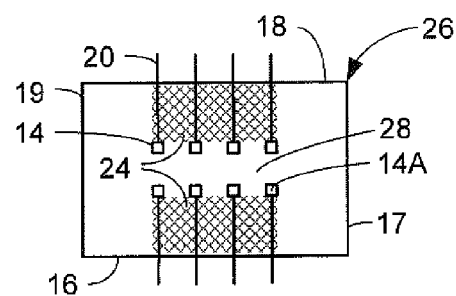
FIG. 2 is a simplified plan view of a conventional center bonded die.

FIG. 2 illustrates a conventional center bonded die 26, such as a DRAM, having bond pads 14 at a central region 28 of die 26. Wires 20 extending from bond pads 14 define, in this example, wire span areas 24 between the two sets of bond pads 14 and peripheral edges 16, 18. The distance between bond pads 14 and the corresponding peripheral edges for a center bonded die is preferably much more than 100 micrometers. More preferably, the distance between a bond pad 14 for a center bonded die 26 and the nearest peripheral edge is at least about 40% of the corresponding length or width of the die. For example, the distance between a bond pad 14A and peripheral edge 16 is at least about 40% of the length of peripheral edge 17. Assuming for example that peripheral edge 17 is 8 mm long, the distance between bond pad 14A and peripheral edges 16 is at least about 3.2 mm.

Figure 3:
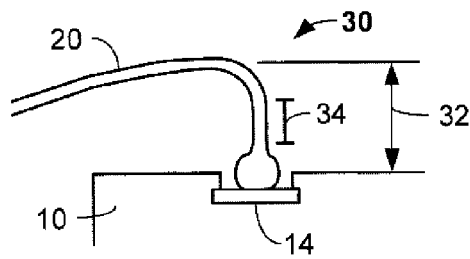
FIGS. 3 and 4 illustrate conventional forward loop and reverse wire bonds.
Figure 4:
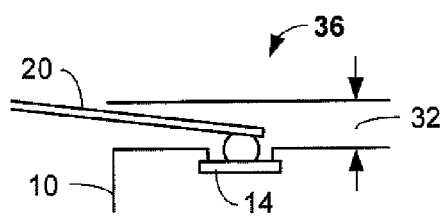

FIGS. 3 and 4 illustrate conventional forward loop wire bonding and conventional reverse wire bonding techniques. Forward loop wire bond 30 of FIG. 3 has a wire loop height 32, typically about 60-100 micrometers. Wire 20 has a recrystallization zone 34. Recrystallization zone 34 is not as flexible as the remainder of wire 20 so that excessive flexion of wire 20 within zone 34 may cause wire 22 to break. Therefore, in it is important that wire 20, especially within recrystallization zone 34, not be deformed to any significant degree during manufacturing. This is especially important in the manufacture of multi-chip packages. To reduce the loop height 32 and eliminate recrystallization zone 34 above bond pads 14, a reverse wire bond 36, shown in FIG. 4, may be used. Reverse wire bonds 36 typically have a loop height 32 of about 40-70 micrometers. Forward loop wire bonding, shown in FIG. 5, is often preferred over reverse wire bonding because it has a much larger throughput and the therefore a lower cost.

Figure 5:
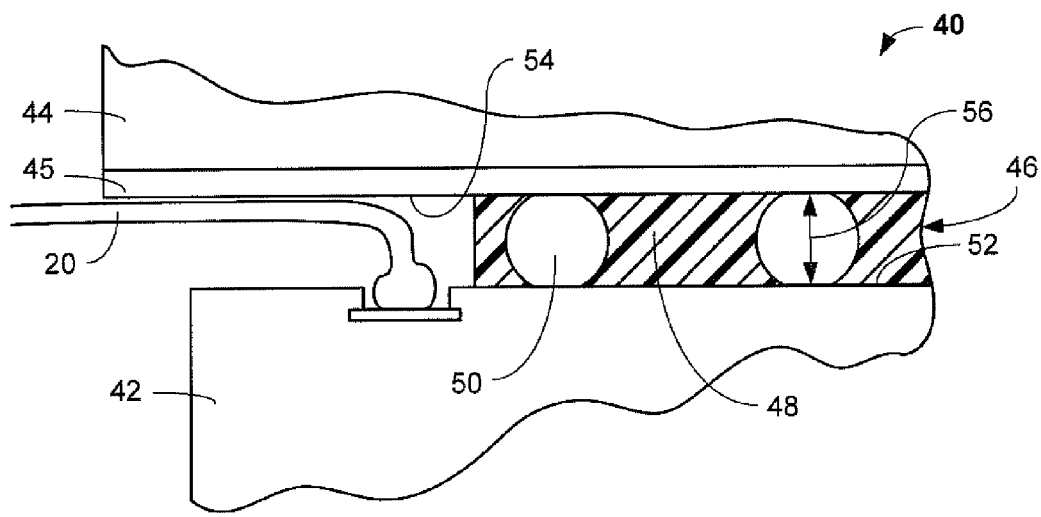
FIG. 5 is a partial cross sectional view of a multi-die semiconductor assembly made according to the invention.
Figure 6:
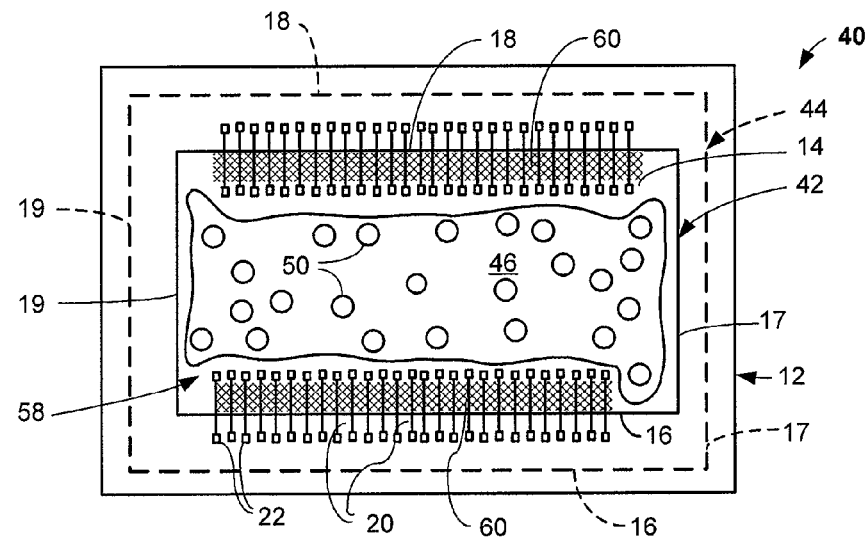
FIG. 6 is a top plan view of the assembly of FIG. 5 with the periphery of the upper die shown in dashed lines.

FIG. 5 illustrates a partial cross sectional view of a multi-die semiconductor assembly 40 made according to the invention. Assembly 40 includes a lower die 42 having a first surface bounded by a periphery around bond pads at the first surface and an upper die 44, which may include a packaged die providing an electrically non-conductive lower surface 54. Wires 20, spaced apart and extending generally in parallel bonded to and extending from the bond pads, are substantially parallel to the first surface over substantially all of the periphery. The wires 20, within the wire span portion 60 of first adhesive region 58 (refer to FIG. 6), are parallel with and adjacent to the electrically non-conductive lower surface 54 of the upper die 44. Assembly 40 protects against shorting of wires 20 against upper die 44 in two basic ways. First, upper die 44 has electrically insulating layer 45, typically a dielectric film adhesive, such as available from Lintec Corporation as Lintec LE5000 or an Hitachi DF series film adhesive. Second, lower die 42, also shown in FIG. 6, is secured to upper die 44 with an adhesive/spacer structure 46. Structure 46 includes adhesive 48 and spacer elements 50. Structure 46 may be a conventional material such as Loctite® QMI536-3, 4, or 6, which use nominal 3, 4 or 6 mil (75, 100 and 150 micrometers) diameter organic polymer spherical particles as spacer elements 50; or a spacer adhesive from the Ablestik 2025 Sx series. It is preferred that spacer elements 50 be of an organic polymer material and pliable and large enough to permit forward loop wire bonding. Spacer elements 50 are typically about 30-250 micrometers in diameter. Structure 46 also helps to provide bond line thickness control and die tilt control. Prevention of the incursion of the adhesive/spacer material, and in particular spacers 50, into wire span portion 60 of first, adhesive region 58 (refer to FIG. 6) may be achieved by, for example, depositing the adhesive/spacer material at selected positions and carefully controlling the amount deposited at each position. Examples of suitable materials for spacer elements 50 include PTFE and other organic polymers.

Spacer elements 50, prior to use, are typically spherical, ellipsoidal, cylindrical with hemispherical or ellipsoidal ends, or the like. After assembly, assuming spacer elements 50 are compressible, spacer elements 50 are compressed to some degree and have flattened areas where they contact upper surface 52 of lower die 42 and the electrically non-conductive lower surface 54 of upper die 44; the shape of such spacers is collectively referred to as generally ellipsoidal. For example, an initially spherical spacer element 50 having an 8 mil (200 micrometer) diameter will typically compress to a height of about 7.5 mil (188 micrometers). The height 56 of spacers 50, which is equal to the distance between surface 52 and 54, is preferably at least equal to loop height 32, is more preferably greater than loop height 32, is even more preferably at least about 10% greater than loop height 32. If desired, the selection of the spacer elements includes selecting spacer elements so that height 56 is equal to the design loop height 32 plus an allowance for manufacturing tolerance build-up resulting from making the wire bonds, the variance in the size and compressibility the of spacer elements 50 and other appropriate variables.

FIG. 6 illustrates assembly 40 with upper die 44 indicated by dashed lines. Lower and upper die 42, 44 define a first, adhesive region 58 therebetween. In the embodiment of FIGS. 5 and 6, region 58 is defined by the periphery of lower die 42 because upper die 44 extends beyond the entire periphery of the lower die. Wire span areas 24, indicated by cross-hatching, define wire span portions 60 of first, adhesive region 58. The adhesive/spacer material is deposited in a manner so that, as shown in FIG. 6, adhesive/spacer structure 46 is located at other than wire span portions 60 of first, adhesive region 58. The adhesive/spacer structure 46 extending around at least two sides of one of the wire span portions 60. Doing so helps to ensure that spacer elements 50 do not interfere with wires 20 thus eliminating the possibility of a spacer element causing one or more wires 22 to deflect to contact and thus short, for example, an adjacent wire 22.

Figure 7:
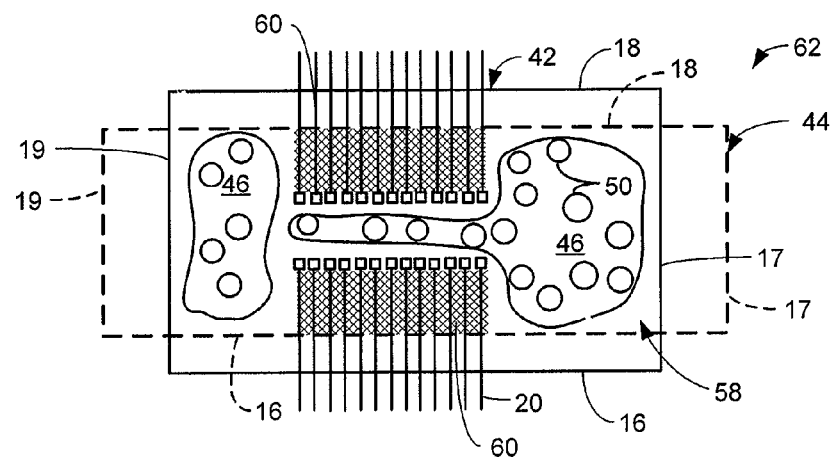
FIG. 7 illustrates an alternative embodiment to the assembly of FIG. 6.

FIG. 7 illustrates a multi-die semiconductor assembly 62 in which lower die 42 is a center bonded die such as shown in FIG. 2 and upper die 44, shown in dashed lines, is longer but narrower than lower die 42. Therefore, in this embodiment first, adhesive region 58 does not cover the entire lower die 42 but rather is bounded by peripheral edges 17 and 19 of lower die 42 and peripheral edges 16 and 18 of upper die 44. Adhesive/spacer structure 46 is, in the embodiment of FIG. 6, formed in two portions and is located within first, adhesive regions 58 at other than wire span portions 60. The adhesive/spacer structure 46 extending around three sides of each of the wire span portions 60. Adhesive/spacer structure 46 may define a single adhesive/spacer structure region as shown in FIG. 6 or two or more adhesive/spacer structure regions, such as shown in FIG. 7.

Adhesive/spacer material may be deposited using a conventional dispenser capillary. However, it is preferred that the adhesive/spacer material be deposited using a showerhead type of dispenser as shown in the above-mentioned US Provisional patent application entitled Adhesive/Spacer Island Structure For Multiple Die Package. Doing so can facilitate the positioning of the adhesive/spacer material at spaced apart locations to provide the desired coverage by adhesive/spacer structure 46. This may be especially advantageous when working with center bonded die.

Figure 8:
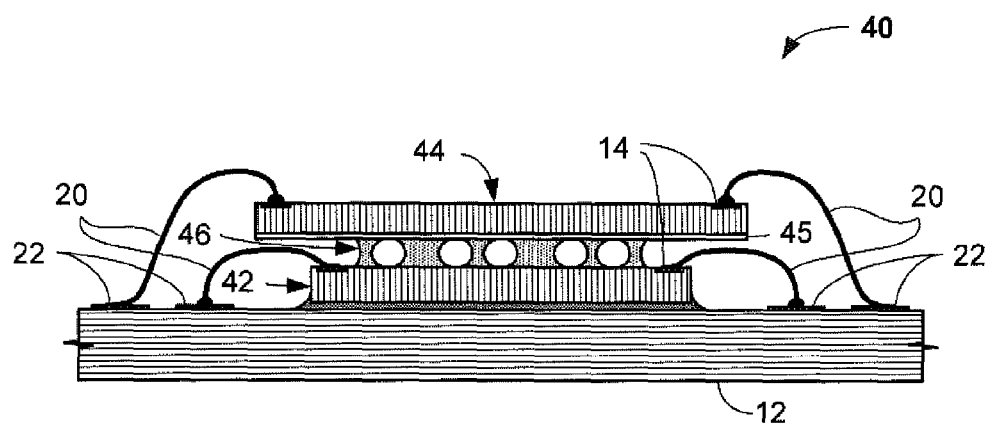
FIG. 8 is a side cross sectional view of the assembly of FIGS. 5 and 6.
Figure 9:
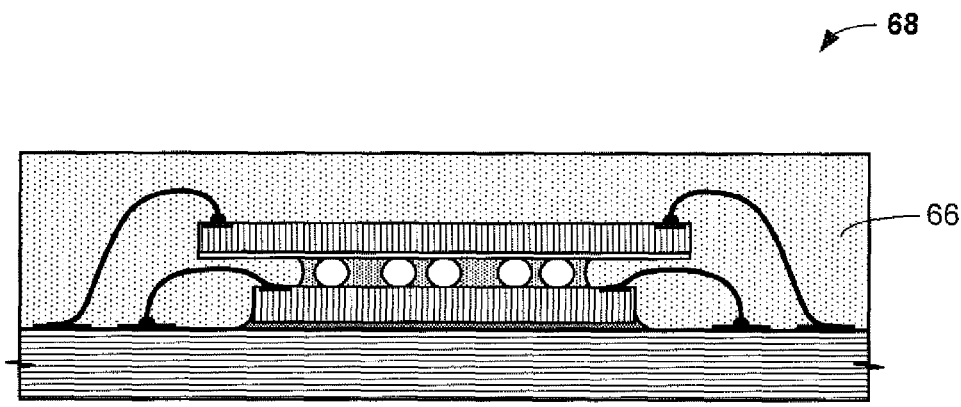
FIG. 9 shows the assembly of FIG. 8 after encapsulation with a molding compound to create a multiple die semiconductor chip package.

FIG. 8 is a side cross sectional view of multi-die semiconductor assembly 40 of FIGS. 5 and 6 showing wires 20 extending from bond pads 14 of upper and lower die 44, 42 to bond pads 22 of substrate 12. FIG. 9 illustrates the structure of FIG. 8 after a molding compound 66 has been applied to create a multiple die semiconductor chip package 68.

Figure 10:
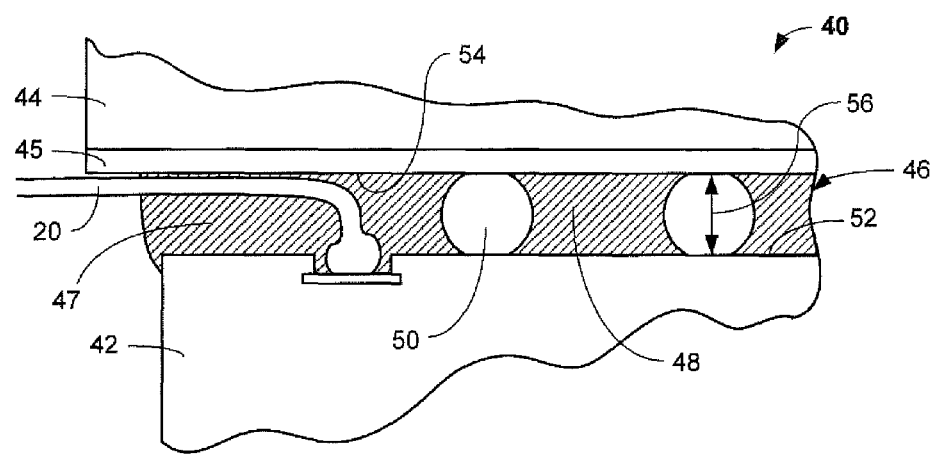
FIG. 10 illustrates an alternative embodiment similar to that of FIG. 5 in which adhesive fills the wire span portion of the adhesive region.

Spacer elements 50 may also be prevented from incursion into wire span portion 60 by sizing the spacer elements so as not to fit between the generally parallel wires 20. In this way wires 20 act as a sieve or strainer to permit a portion 47 of adhesive 48 to enter into wire span portion 60 but prevent spacer elements 50 from doing so. This is illustrated in FIG. 10, showing adhesive/spacer structure 46 including adhesive 48, with spacer elements 50 situated in regions other than the wire span portion of the adhesive region, and showing a portion 47 of adhesive 48 having entered into the wire span portion of the adhesive region. In such embodiments, the spacer elements provide a suitable distance between the two die, the lower surface of the upper die being electrically insulated by dielectric layer 45, as described above with reference to FIG. 5. The full occupancy of adhesive region 58 by adhesive 48, particularly the portion 47 of the adhesive in the wire span region, eliminates the open overhang of the upper die above wires 20 shown in FIG. 5. This provides some support for the upper die, and helps to reduce or eliminate die breakage, which is especially useful for large and thin semiconductor devices.

Figure 11:
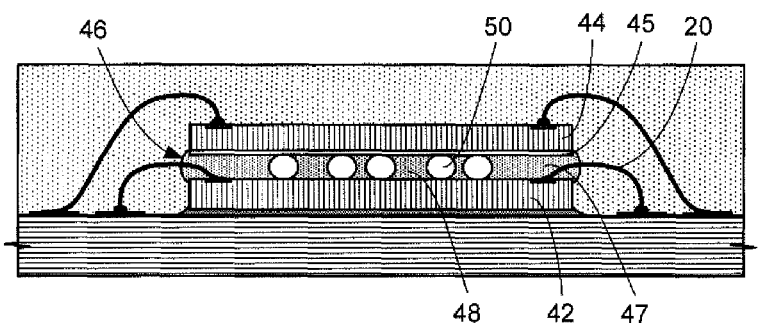
FIG. 11 illustrates an alternative embodiment in a view similar to that of FIG. 9 but in which the upper die does not overhang the edge of the lower die, and in which adhesive fills the wire span portion of the adhesive region as in FIG. 10.

The adhesive/spacer structure according to the invention can be useful for multi-die assembly structures in which the upper die 44 does not extend over the edge of the lower die 42, as illustrated in FIG. 11, which is a view similar to the view of FIG. 9. Here, as in FIG. 10, spacer structure 46 including spacer elements 50 and adhesive 48 is formed between the upper die 44 with insulating layer 45, and the lower die 42. The wires 20 prevent the spacer elements from entering into the wire span region, but permit a portion 47 of the adhesive 48 to fill the volume there and provide support for the part of the upper 44 die that overhangs the wire loops 20.

Figure 12:
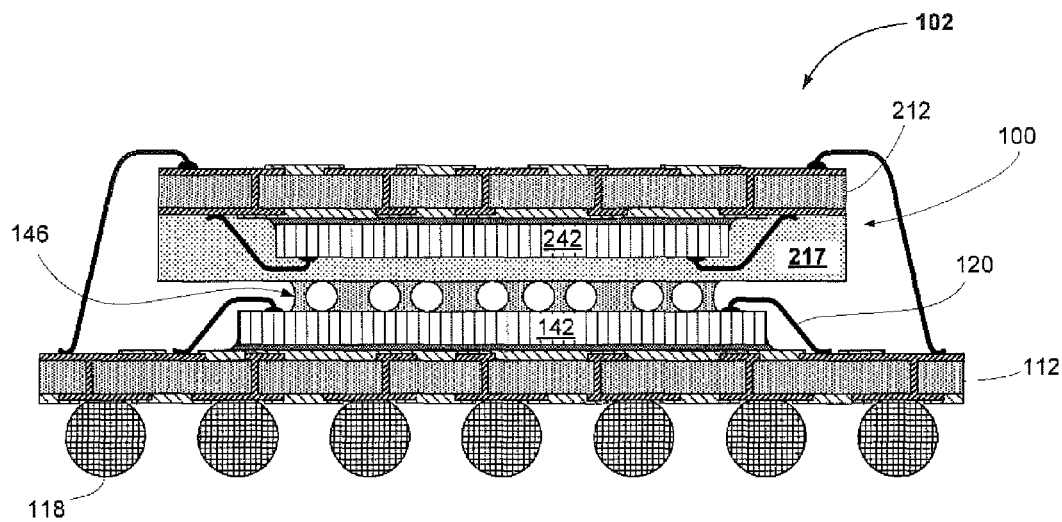
FIGS. 12 through 15 illustrate embodiments of assemblies according to various aspects of the invention in which a package and a die are stacked.
Figure 13:
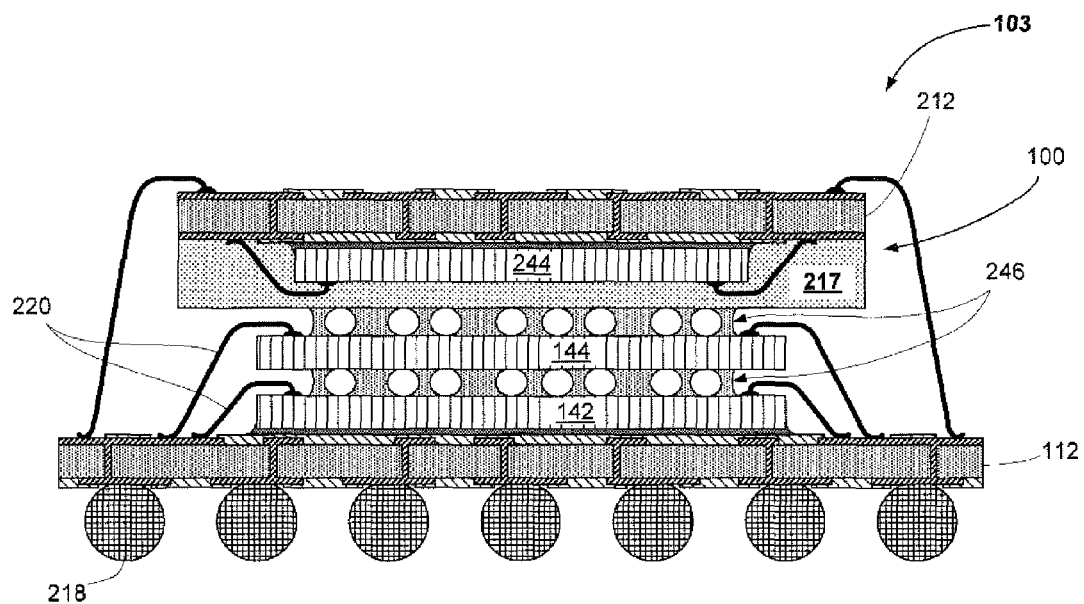

In other embodiments, a stacked semiconductor assembly includes a package stacked with a die, separated by an adhesive/spacer material generally as described above for stacked die assemblies. FIGS. 12 and 13 illustrate examples 102, 103 of such assemblies, in which an inverted package is stacked over a die. Referring to FIG. 12, a lower, peripheral bonded die 142 is mounted upon a substrate 112, and bond pads on the die are electrically interconnected with bond pads on the substrate by wire bonds 120. An adhesive/spacer structure 146 is formed upon the die 142 including an adhesive and spacer elements as described above with reference to adhesive/spacer structure 46. An upper package 100 is inverted and mounted upon the adhesive/spacer structure 146, in substantially the same manner as the upper die 44 is mounted upon adhesive/spacer structure 46 in the stacked die assembly 40, for example, of FIG. 8.

The upper package 100 in this example is a land grid array package, having a die 242 mounted onto a die attach side on upper package substrate 112. Die 242 in this example is wire bonded to substrate 112, and the die and wire bonds are enclosed in an encapsulation 217. The package 100 is inverted so that the land side of the substrate 212 faces away from the first die 142 and substrate 212, and so that an upper surface of the encapsulation 217 faces toward the first die 142 and substrate 212. In the orientation of FIG. 12, the land side of the inverted upper package 212 is upward-facing, and the upper package is electrically interconnected with the bottom substrate 212 by wire bonds between bond pads on the land side of the upper package substrate 212 and bond pads on the upward-facing side of the lower substrate 112. The assembly is then encapsulated (not shown in FIG. 12) to form a package, substantially as the stacked die assembly 40 of FIG. 8 is encapsulated to form the package 68 of FIG. 9. Solder balls 118 are mounted onto pads on the downward-facing side of the substrate 112, for interconnection of the package to, for example, a motherboard. Multiple chip modules having inverted package stacked over a die, in which the adhesive/spacer structures described herein may be particularly suitable, are described in U.S. patent application Ser. No. 11/014,257.

In other embodiments, two (or more) die may be stacked using an adhesive/spacer structure over one another on a lower substrate, and a package may be stacked over the uppermost one of the stacked die, using an adhesive/spacer structure, as shown by way of example in FIG. 13. Here, a die 142 is mounted onto a lower substrate 112, and a die 144 is stacked over the die 142, and separated from it by an adhesive/spacer structure 246 as described above for stacked die assemblies. Die 142 and 144 are electrically interconnected with substrate 112 by wire bonds 220. An inverted package 100 is mounted over the stacked die 142, 144, separated by the die 144 by and adhesive/spacer structure 246, as described above with reference to FIG. 12. As will be appreciated, either or both of the spacers, between the die, and between the die and the inverted package, may be an adhesive/spacer structure as described above with reference to stacked die assemblies.

Any of a variety of packages may be stacked over the die in assemblies according to these embodiments of the invention. Stacked multi-package modules having inverted upper packages are described in U.S. patent application Ser. No. 10/681,572; and examples of suitable upper inverted package types are described therein. These include, for example, besides land grid array packages as illustrated in FIGS. 12 and 13, bump chip carrier packages; and the upper package may include more than one die. Where the upper package encapsulant has a generally planar surface that contacts the adhesive/spacer structure, that surface (termed the "second" surface) is itself electrically nonconductive, and application of an additional insulating layer (as layer 45 in FIGS. 5, 8, 10 and 11) may be optional in such embodiments. Where, however, the second surface of the upper package is an electrically conductive material (such as a metal heat spreader, for example) or includes exposed electrically conductive areas or elements, an insulating layer 45 should be applied, as described above with reference for example to FIG. 5.

Figure 14:
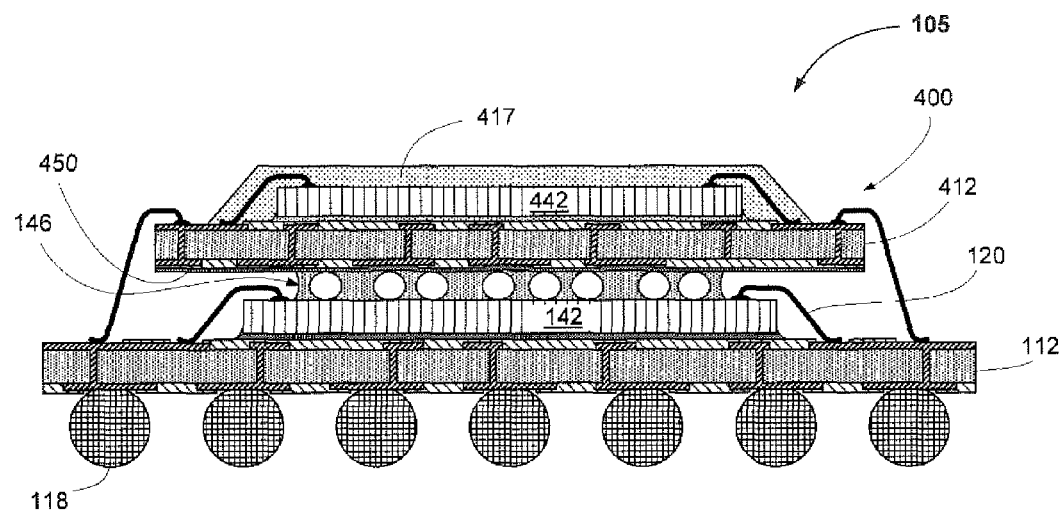
Figure 15:
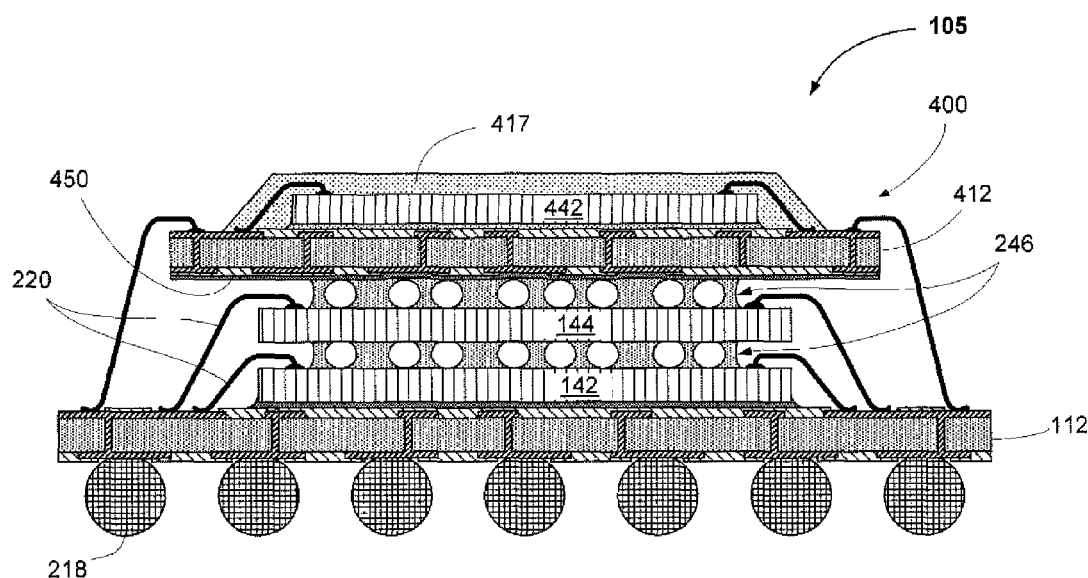

In still other embodiments, in which a stacked semiconductor assembly includes a package stacked with a die, separated by an adhesive/spacer material generally as described above for stacked die assemblies, the upper package is not inverted. FIGS. 14 and 15 illustrate examples 104, 104 of such assemblies. Referring to FIG. 14, a lower, peripheral bonded die 142 is mounted upon a substrate 112, and bond pads on the die are electrically interconnected with bond pads on the substrate by wire bonds 120. An adhesive/spacer structure 146 is formed upon the die 142 including an adhesive and spacer elements as described above with reference to adhesive/spacer structure 46. An upper package 400 is inverted and mounted upon the adhesive/spacer structure 146, in substantially the same manner as the upper die 44 is mounted upon adhesive/spacer structure 46 in the stacked die assembly 40, for example, of FIG. 8.

The upper package 400 in this example is a land grid array package, having a die 442 mounted onto a die attach side on upper package substrate 412. Die 442 in this example is wire bonded to substrate 412, and the die and wire bonds are enclosed in a mold cap 417. Here the package 400 is oriented so that the land side of the substrate 412 faces toward the first die 142 and substrate 212, and so that the land side of the upper package substrate 412 faces toward the first die 142 and substrate 212. In the orientation of FIG. 14, the land side of the inverted upper package 412 is downward-facing, and the upper package is electrically interconnected with the bottom substrate 112 by wire bonds between bond pads on the upward-facing (die attach) side of the upper package substrate 412 and bond pads on the upward-facing side of the lower substrate 112. The assembly is then encapsulated (not shown in FIG. 14) to form a package, substantially as the stacked die assembly 40 of FIG. 8 is encapsulated to form the package 68 of FIG. 9. Solder balls 118 are mounted onto pads on the downward-facing side of the substrate 112, for interconnection of the package to, for example, a motherboard.

In other embodiments, two (or more) die may be stacked using an adhesive/spacer structure over one another on a lower substrate, and a package may be stacked over the uppermost one of the stacked die, using an adhesive/spacer structure, as shown by way of example in FIG. 15. Here, as in FIG. 13, a die 142 is mounted onto a lower substrate 112, and a die 144 is stacked over the die 142, and separated from it by an adhesive/spacer structure 246 as described above for stacked die assemblies. Die 142 and 144 are electrically interconnected with substrate 112 by wire bonds 220. An inverted package 100 is mounted over the stacked die 142, 144, separated by the die 144 by and adhesive/spacer structure 246, as described above with reference to FIG. 14. As will be appreciated, either or both of the spacers, between the die, and between the die and the inverted package, may be an adhesive/spacer structure as described above with reference to stacked die assemblies.

Any of a variety of packages may be stacked over the die in assemblies according to these embodiments of the invention. Stacked multi-package modules suitable upper packages are described in U.S. patent application Ser. Nos. 10/632,549; 10/632,568; 10/632,551; 10/632,552; 10/632,553; and 10/632,550; and examples of suitable upper package types are described therein. These include, for example, besides land grid array packages as illustrated in FIGS. 14 and 15, bump chip carrier packages, and flip chip packages; and the upper package may include more than one die. Where the downward-facing surface of the upper package ("second" surface) had electrically conductive elements or areas, application of an additional insulating layer (as layer 45 in FIGS. 5, 8, 10 and 11) may be required and may be applied as described above with reference for example to FIG. 5, and as shown for example at 450 in FIGS. 14 and 15. This additional insulating layer may be applied as a film to the land side of the upper package substrate, and voids between the film and the substrate surface removed by heating at low pressure, according to techniques known in the art.

Other devices may be stacked over the first die, and separated therefrom by an adhesive/spacer structure as described above, and provided with an insulating layer as appropriate. For example, a metal heat spreader may be stacked upon an adhesive/spacer structure over the first die in place of the upper die or upper package in the descriptions above.

The assemblies and packages according to the invention can be useful in any of a variety of products, such as for example computers, mobile telecommunications devices, personal digital assistance devices, media storage devices, particularly portable cameras and audio and video equipment.

Any and all patents, patent applications and printed publications referred to above are incorporated by reference.

Other modification and variation can be made to the disclosed embodiments without departing from the subject of the invention as defined in following claims.

What is claimed is:

1. A stacked semiconductor assembly comprising:
   a first die having a first surface bounded by a periphery around bond pads at the first surface;
   wires spaced apart and extending generally in parallel bonded to and extending from the bond pads outwardly past the periphery, the wires extending to a maximum height h above the first die;
   a package, comprising a package die mounted over and electrically interconnected with a die attach surface of a package substrate, the package having an electrically non-conductive second surface positioned opposite the die attach surface;
   the first die and the package defining a first region therebetween;
   a wire span portion of the first region formed by said wires comprising a set of generally parallel wires includes said wires parallel with and adjacent to the second surface of the package in the wire span portion of the first region, the wires configured to act as a sieve for spacer elements within a flowable adhesive in the wire span portion;
   an adhesive/spacer structure within the first region, the adhesive/spacer structure contacting the first and second surfaces and adhering the first die and the package to one another, the adhesive/spacer structure comprising the spacer elements sized for preventing incursion between the parallel wires with the spacer elements within the flowable adhesive, the adhesive/spacer structure extending around at least two sides of the wire span portion; and a molding compound.

2. The assembly according to claim 1 wherein the wires comprise a plurality of sets of generally parallel wires, said plurality of sets of generally parallel wires defining a plurality of wire span portions of the first region.

3. The assembly according to claim 1 wherein the spacer elements are sized so as not to fit between the generally parallel wires.

4. The assembly according to claim 1 wherein the adhesive/spacer structure defines first and second spaced-apart adhesive/spacer structure regions.

5. The assembly according to claim 1 wherein the first die has a length and a width and a central region.

6. The assembly according to claim 5 wherein the first die comprises a center-bonded die with at least some of said die pads positioned at the central region.

7. The assembly according to claim 6 wherein at least one of the spacer elements is positioned within the central region.

8. The assembly according to claim 1 wherein the spacer elements have a height H with H being at least about equal to h.

9. The assembly according to claim 8 wherein H is greater than h.

10. The assembly according to claim 8 wherein H is at least about 10% greater than h.

11. The assembly according to claim 1 wherein the spacer elements are generally ellipsoidal.

12. The assembly according to claim 11 wherein the spacer elements are flattened spheres.

13. The assembly according to claim 11 wherein the spacer elements are about 30 um-250 um in diameter.

14. The assembly according to claim 1 wherein the spacer elements are all substantially the same size.

15. The assembly according to claim 1 wherein the spacer elements comprise an organic and pliable solid material.

16. The assembly according to claim 1 wherein the spacer elements comprise at least PTFE.

17. The stacked semiconductor assembly of claim 1 wherein the package is oriented so that the die attach side of the upper package substrate faces toward the first die.

18. The assembly of claim 1 wherein the upper package is oriented so that electrically non-conductive second surface of the upper package substrate faces toward the first die.

19. Stacked semiconductor packages comprising the assembly of claim 1.

20. A method of manufacture of a stacked semiconductor assembly the method comprising:
   selecting an adhesive/spacer material having spacer elements within a flowable adhesive;
   depositing the adhesive/spacer material onto a first surface of a first die, the first die having a first surface bounded by a periphery, bond pads at the first surface, and wires bonded to and extending from the bond pads outwardly past the periphery, the wires extending to a maximum height h above the first die, the wires comprising a set of generally parallel wires, the wires configured to act as a sieve for the spacer elements within the flowable adhesive, the set of generally parallel wires defining a wire span portion of the first surface;
   selecting a package, comprising a package die mounted over and electrically interconnected with a die attach surface of a package substrate, the package having an electrically non-conductive surface positioned opposite the die attach surface parallel with an adjacent to the wires;
   locating the electrically non-conductive surface of the package opposite the first surface of the first die and in contact with the adhesive/spacer material there between thereby securing the package and the first die to one another at a chosen separation, the wire span portion of the first surface defining a wire span region between first and second surfaces, the flowable adhesive in the wire span region; and
   covering a molding compound over the first die and the package.

21. The method according to claim 20 further comprising preventing any adhesive/spacer material from entering the wire span region.

22. The method according to claim 20 wherein the preventing step comprises using spacer elements sized so as not to fit between the generally parallel wires.

23. The method according to claim 20 wherein the depositing step is carried out a manner to prevent any adhesive/spacer material from entering the wire span region.

24. The method according to claim 20 wherein the selecting step is carried out to select spacer elements having the same size and shape.

25. The method according to claim 20 wherein the depositing step is carried out with the first die having a length and a width and a central region.

26. The method according to claim 25 wherein the depositing step is carried out with the first die comprising a center-bonded die with at least some of said die pads positioned at the central region.

27. The method according to claim 26 wherein depositing step comprises positioning at least some of the adhesive/spacer material within the central region so that at least one spacer element is positioned within the central region.

28. The method according to claim 20 wherein the adhesive/spacer material selecting step comprises selecting spacer elements having a height H with H being at least about equal to h.

29. The method according to claim 28 wherein the spacer elements selecting step comprises selecting spacer elements in which H is greater than h.

30. The method according to claim 28 wherein the spacer elements selecting step comprises determining an allowance for manufacturing tolerance buildup and selecting spacer elements so that H is equal to h plus the allowance for the manufacturing tolerance buildup.

31. The method according to claim 28 wherein the spacer elements selecting step comprises determining an allowance for manufacturing tolerance buildup and selecting spacer elements so that H is greater than h plus the allowance for the manufacturing tolerance buildup.

32. The method according to claim 28 wherein the spacer elements selecting step comprises selecting spacer elements so that H is at least about 10% greater than h.

* * * * *

UNITED STATES PATENT AND TRADEMARK OFFICE
CERTIFICATE OF CORRECTION

PATENT NO. : 8,030,134 B2
APPLICATION NO. : 11/536424
DATED : October 4, 2011
INVENTOR(S) : Kwon et al.

It is certified that error appears in the above-identified patent and that said Letters Patent is hereby corrected as shown below:

Column 3:

line 40, delete "FIGS. 3 and 4" and insert therefor --FIGs. 3 and 4-- line 49, delete "FIGS. 5 and 6;" and insert therefor --FIGs. 5 and 6;-- line 60, delete "FIGS. 12 through 15" and insert therefor --FIGs. 12 through 15--

Column 4:

line 17, delete "has bond Dads 14" and insert therefor --has bond pads 14-- line 41, delete "FIGS. 3 and 4" and insert therefor --FIGs. 3 and 4--

Column 5:

line 52, delete "FIGS. 5 and 6," and insert therefor --FIGs. 5 and 6,--

Column 6:

line 24, delete "of FIGS. 5 and 6" and insert therefor --of FIGs. 5 and 6-- line 64, delete "FIGS. 12 and 13" and insert therefor --FIGs. 12 and 13--

Column 7:

line 57, delete "FIGS. 12 and 13," and insert therefor --FIGs. 12 and 13,-- line 63, delete "FIGS. 5, 8, 10" and insert therefor --FIGs. 5, 8, 10--

Column 8:

line 7, delete "FIGS. 14 and 15" and insert therefor --FIGs. 14 and 15-- line 63, delete "FIGS. 14 and 15," and insert therefor --FIGs. 14 and 15,--

Signed and Sealed this
Twenty-fourth Day of April, 2012

David J. Kappos
*Director of the United States Patent and Trademark Office*

Column 9:

lines 1-2, delete "FIGS. 5, 8, 10" and insert therefor --FIGs. 5, 8, 10-- line 4, delete "FIGS. 14 and 15." and insert therefor --FIGs. 14 and 15.--

Column 10:

claim 13, line 19, delete "30 um-250 um" and insert therefor --30um - 250um-- claim 20, line 60, delete "between first" and insert therefor --between the first--